United States Patent [19]
Rao

[11] Patent Number: 5,881,074
[45] Date of Patent: Mar. 9, 1999

[54] 1000BASE-T PACKETIZED TRELLIS CODER

[75] Inventor: Sailesh Krishna Rao, Colts Neck, N.J.

[73] Assignee: Level One Communications, Inc., Sacramento, Calif.

[21] Appl. No.: 924,066

[22] Filed: Aug. 28, 1997

Related U.S. Application Data

[60] Provisional application No. 60/042,067, Mar. 25, 1997.

[51] Int. Cl.$^6$ .......................... G06F 11/10; H03M 13/12
[52] U.S. Cl. ........................ 371/431; 375/262; 375/265
[58] Field of Search .............................. 371/43.1, 37.01, 371/37.02, 37.03, 37.04, 43.3, 43.4, 43.6, 43.7, 43.8; 375/262–265

[56] References Cited

U.S. PATENT DOCUMENTS

| | | | |
|---|---|---|---|
| 4,622,670 | 11/1986 | Martin | 371/43.1 |
| 5,023,889 | 6/1991 | Divsalav et al. | 375/244 |
| 5,319,707 | 6/1994 | Wasilewski et al. | 380/14 |
| 5,359,320 | 10/1994 | Jaffee et al. | 370/448 |
| 5,418,531 | 5/1995 | Laroia | 341/94 |
| 5,497,384 | 3/1996 | Fredrickson et al. | 371/43.4 |
| 5,519,443 | 5/1996 | Salemon et al. | 348/467 |
| 5,535,228 | 7/1996 | Dong et al. | 371/49.1 |
| 5,548,615 | 8/1996 | Wei | 375/281 |
| 5,559,835 | 9/1996 | Betts | 375/265 |
| 5,699,062 | 12/1997 | Widmer | 341/58 |

FOREIGN PATENT DOCUMENTS 0 735 706 A2  10/1996  European Pat. Off. .

OTHER PUBLICATIONS

G. Ungerboeck, "Trellis Coded Modulation with Redundant Signal Sets, Parts 1 and 2," *IEEE Communications Magazine*, vol. 25, No. 2, pp. 5–21 (1987).

*Primary Examiner*—Emmanuel L. Moise
*Attorney, Agent, or Firm*—Merchant, Gould, Smith, Edell, Welter & Schmidt, P.A.

[57] ABSTRACT

A packetized trellis coder and method is disclosed for providing error correction coding of IEEE 802.3 frame formatted Ethernet packets for transmission at one gigabit per second (Gbps) over twisted-pair wiring has been disclosed. The error correction code protects each byte of the ethernet frame with a parity bit constructed using a convolutional encoder such that a maximum likelihood sequence estimation at the receiver using a Viterbi decoder will result in a significant receiver performance gain. At the end of the Ethernet packet, the trellis coder restores the states of the convolutional encoder to a known value (state 0) before beginning Idle transmission so that the Viterbi decoder at the receiver can read off the end-of-packet symbols without any performance penalty. The mapping and the inverse mapping from raw data bits to symbols and vice-versa can be implemented with simple gates due to algorithmic symbol mapping of a 4-D trellis code via 1-D partitioning. The same redundancy that is needed for control code transmission in Ethernet frames is used to achieve the trellis coding and to improve receiver performance.

33 Claims, 6 Drawing Sheets

FIG. 3

| Subset | T_D[1] T_D[0] Parity | X-Primary Code (Pair A first) | Y-Primary Code (Pair A first) |
|---|---|---|---|
| D0 | 000 | XYXY — 330 | YXYX — 340 |
| D1 | 001 | XYYY | YXXX |
| D2 | 010 | XYYX | YXXY |
| D3 | 011 | XYXX | YXYY |
| D4 | 100 | XXXX | YYYY |
| D5 | 101 | XXYX | YYXY |
| D6 | 110 | XXYY | YYXX |
| D7 | 111 | XXXY | YYYX |

1000BASE-T PACKETIZED TRELLIS CODER

This application claims benefit of provisional application 60/042,067 filed Mar. 25, 1997.

BACKGROUND OF THE INVENTION

1. Field of the Invention

This invention relates in general to a error correction coding, and more particularly to a packetized trellis coder for error correction coding of Ethernet packets for transmission at one gigabit per second over twisted-pair wiring.

2. Description of Related Art

Gigabit Ethernet promises to breath new life into the Ethernet world by prolonging the life of Ethernet LAN technology into the next century. Gigabit Ethernet is the Ethernet solution for satisfying ever-increasing bandwidth consuming applications at an affordable cost, while complying with Ethernet standards. The existing Ethernet infrastructure is used and promises ease of migration without any changes to existing network operating systems and applications. In July 1996, just five months after the 802.3u Task Force approved standards for fast Ethernet, the IEEE instituted the 802.3z Task Force to define standards for Ethernet operation at one gigabit per second (1.0 Gbps).

The Gigabit Ethernet market will be driven by user needs for faster response times, more segment capacity, and substantial improvements in backbone bandwidth and server performance. Desktop computers are increasing in speed at a rapid rate. The Peripheral Connection Interface (PCI) is the interface of preference because it runs at high speeds. A 32-bit PCI runs at 1.056 Gbps, while the new 64-bit PCI doubles that speed. Also, workstation and server performances are advancing, enabling these devices to flood multiple fast Ethernet links with network traffic.

Gigabit Ethernet technology is not simply an upgraded version of Ethernet or fast Ethernet. Nevertheless, Gigabit Ethernet will be inter-operable with both technologies and preserve the fundamental precepts of standard Ethernet framing. Gigabit Ethernet will also comply with the 802.3 standard for frame format and minimum and maximum frame size. However, the physical layer will be different.

Like fast Ethernet, Gigabit Ethernet operates in either half- or full-duplex mode. In full-duplex mode, packets travel in both directions simultaneously over two paths on the same connection for an aggregate bandwidth of double that of half-duplex operation. For example, a full-duplex fast Ethernet connection provides an aggregate bandwidth of 200 Mbps, while a full-duplex Gigabit Ethernet connection yields an aggregate of 2.0 Gbps. Full-duplex transmission can be used for point-to-point connections only. Since full-duplex connections cannot be shared, collisions are eliminated, and the CSMA/CD access control mechanism is disabled. Full-duplex transmission can be deployed between ports on two switches, a server or workstation and a switch port, or between two workstations. Full-duplex connections cannot be used for shared-port connections, such as a repeater or hub port that connects multiple workstations.

An optional flow-control mechanism, presently being defined by the 802.3x Task Force, is available for full-duplex transmission and is similar to XON/XOFF flow control. A receiving station at one end of a point-to-point link sends a packet to the sending station instructing the sending station to halt packet transmission for a specified period of time. The sending station ceases packet transmission until the time interval is past or until it receives a new packet from the receiving station with a time interval of zero. It then resumes packet transmission.

For half-duplex operation, Gigabit Ethernet will retain the standard Ethernet CSMA/CD access method. Half-duplex operation is intended for shared multi-station LANs, where two or more end stations share a single port. Most switches enable users to select half- or full-duplex operation on a port-by-port basis, allowing users to migrate from shared segments to point-to-point, full-duplex segments when they are ready. Gigabit Ethernet is most effective when running in the full-duplex, point-to-point mode where full bandwidth is dedicated between the two points. Full-duplex operation is ideal for backbones and high-speed server or router links. In half-duplex mode, Gigabit Ethernet's performance is degraded. It is sensitive to segment length because it uses the CSMA/CD protocol. The standard slot time for Ethernet frames is not long enough to run a 100-meter cable when passing 64-byte frames at gigabit speed. In order to accommodate the short-frame timing problems experienced with CSMA/CD when scaling half-duplex Ethernet to gigabit speed, slot time has been extended to guarantee at least a 512-byte slot time using a technique called carrier extension. The frame size is not changed; only the timing is extended.

The vendor community, through the Gigabit Ethernet Alliance, is promoting Gigabit Ethernet as the technology of choice for high-performance solutions on Ethernet LANs. Gigabit Ethernet is a more attractive alternative than ATM in terms of price and ease of migration, but without the functionality of ATM. Although Gigabit Ethernet will satisfy high-performance needs for data, it may not provide the quality of service that is necessary for high-quality multimedia applications. Unless the quality of service can be improved, delay-sensitive applications, such as video and voice, will not approach the quality provided by ATM. Further, copper media operating at these speeds presents inherent reliability problems.

While ATM is a highly scaleable, multimedia transport technology, Ethernet is primarily intended for data applications and its scaleability is limited. Thus, the window of opportunity for Gigabit Ethernet will undoubtedly be impacted as ATM deployment scales upward and ATM prices continue to decline. Nevertheless Gigabit Ethernet offers the performance needed to satisfy intensive traffic congestion and bandwidth-hungry data applications.

To improve bit error probability, coding techniques have been used extensively in communication systems. For example, block codes and convolutional codes have been used to improve bit error probability by bandwidth expansion. Bandwidth is increased by replacing each k-tuple message with an n-tuple codeword, where n>k. However, bandwidth expansion is not possible with bandlimited channels. Still, combined modulation and coding schemes have been developed to achieve coding gain without any bandwidth expansion. Due to the availability of Viterbi decoders , trellis coding is one of the more popular coding schemes. Nevertheless, trellis codes have been applied to data transmission systems without regard to the packetized or non-packetized nature of the data.

Thus, it can be seen that there is a need for a reliable method for achieving Gigabit Ethernet frame format data transmission using twisted pair wiring.

It can also be seen that there is a need to provide error correction coding of IEEE 802.3 frame formatted Ethernet packets over twisted pair wiring.

SUMMARY OF THE INVENTION

To overcome the limitations in the prior art described above, and to overcome other limitations that will become apparent upon reading and understanding the present specification, the present invention discloses a packetized trellis coder for error correction coding of Ethernet packets for transmission at one gigabit per second over twisted-pair wiring.

The present invention solves the above-described problems by providing error correction coding of IEEE 802.3 frame formatted Ethernet packets for transmission at one gigabit per second (Gbps) over twisted-pair wiring. The error correction code protects each byte of the ethernet frame with a parity bit constructed using a convolutional encoder such that a maximum likelihood sequence estimation at the receiver using a Viterbi decoder will result in a significant receiver performance gain. At the end of the Ethernet packet, the trellis coder restores the states of the convolutional encoder to a known value (state 0) before beginning Idle transmission so that the Viterbi decoder at the receiver can read off the end-of-packet symbols without any performance penalty. The mapping and the inverse mapping from raw data bits to symbols and vice-versa can be implemented with simple gates due to algorithmic symbol mapping of a 4-D trellis code via 1-D partitioning. The same redundancy that is needed for control code transmission in Ethernet frames is used to achieve the trellis coding and to improve receiver performance.

A system in accordance with the principles of the present invention sets a convolutional encoder for generating a parity bit to a known state at the start and end of each data packet, receives an input data word of a data packet, the input word having a set of most significant bits and a set of least significant bits, maps the data word and the parity bit generated by the convolutional encoder over wire-pairs using a multi-level code, uses the parity bit and the set of least significant bits to select one of a plurality of subsets of encoded points and uses the set of most significant bits to select one of a plurality of points within the selected subset of encoded points.

Other embodiments of a system in accordance with the principles of the invention may include alternative or optional additional aspects. One such aspect of the present invention is that the method of mapping the data word further includes the steps of partitioning the multi-level code on each wire pair into a first and second code type, assigning a first distinct tuple pattern using the first and second code types to each of the plurality of subsets of encoded points, the first distinct tuple pattern forming a first primary code for a subset and inverting each code type of the first distinct tuple pattern to form a second primary code for the subset.

Another aspect of the present invention is that the input data word comprises an eight bit data word, the plurality of subsets of encode points comprising eight subsets and the plurality of points within the selected subset of encode points comprising sixty four points.

Another aspect of the present invention is that the multi-level code comprises a four dimensional, five level code, the five level code further comprising a first, a second, a third, a fourth and a fifth code level.

Another aspect of the present invention is that the step of using the most significant bit to select one of the plurality of points within the selected subset of encoded points, further comprises the steps of determining the state of the bits of the input word, when the most significant bit of the set of most significant bits is in an on state, designating the first primary code if the second most significant bit in the set of most significant bits is in an off state and designating the second primary code if the second most significant bit in the set of most significant bits is in an off state, the remaining bits of the set of most significant bits being used to select a point within the designated primary or secondary code and when the most significant bit of the set of most significant bits is in an off state, using the second and third most significant bits of the set of most significant bits to select the position of a first code level and using the three least significant bits of the set of most significant bits to select a point within the selected code on the other wire pairs.

Another aspect of the present invention is that if the point within the designated primary or secondary code or if the point within the selected code on the other wire pairs is in an off state, a fourth level of the five level code is chosen if the point is a first code type and a fifth level of the five level code is chosen if the point is a second code type.

Another aspect of the present invention is that the first code level represents an escape symbol.

Still another aspect of the present invention is that the position of an escape symbol selects either a first primary code or a second primary code within the subset.

Another aspect of the present invention is that a first level code is transmitted on all four wire-pairs to transmit the start or end of packet control code.

Another aspect of the present invention is that a first code level is transmitted on two pairs of the four wire-pairs and non-first code levels are transmitted on the other two pairs of the four wire-pairs to indicate an error indication.

Another aspect of the present invention is that the convolutional encoder comprises a parity enable input, the parity enable input being set to an off state during initialization causes transmission of only points in even subsets, the even subsets having an even number of first type codes and second type codes distributed across the four pairs to double the squared distance between valid points.

Yet another aspect of the present invention is that the convolutional encoder comprises a parity enable input, the parity enable input being set to an on state during initialization causing transmission of points in all subsets to quadruple the distance between valid points.

Another aspect of the present invention is that an end of packet code is delayed by a predetermined number of cycles, the number of cycles being determined by the type of convolutional encoder being used to process the input data word to generate the parity bit.

Another aspect of the present invention is that states in the convolutional encoder are set so that a zero value is obtain by the convolutional encoder after the predetermined number of cycles.

Another aspect of the present invention is that the receiver discards the final number of symbols equal to the predetermined number of cycles.

Another aspect of the present invention is that the parity bit of the convolutional encoder is enabled and disabled on an individual basis by each receiver.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3 is a table showing one example of an assignment including the bit values and parity corresponding to each subset;

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention discloses a packetized trellis coder for providing error correction coding of IEEE 802.3 frame formatted Ethernet packets for transmission at one gigabit per second (Gbps) over twisted-pair wiring. The error correction code protects each byte of the ethernet frame with a parity bit constructed using a convolutional encoder such that a maximum likelihood sequence estimation at the receiver using a Viterbi decoder will result in a receiver performance gain on the order of 5.2 dB. At the end of the Ethernet packet, the trellis coder restores the states of the convolutional encoder to a known value (state 0) before beginning Idle transmission so that the Viterbi decoder at the receiver can read off the end-of-packet symbols without any performance penalty.

Figure 1:
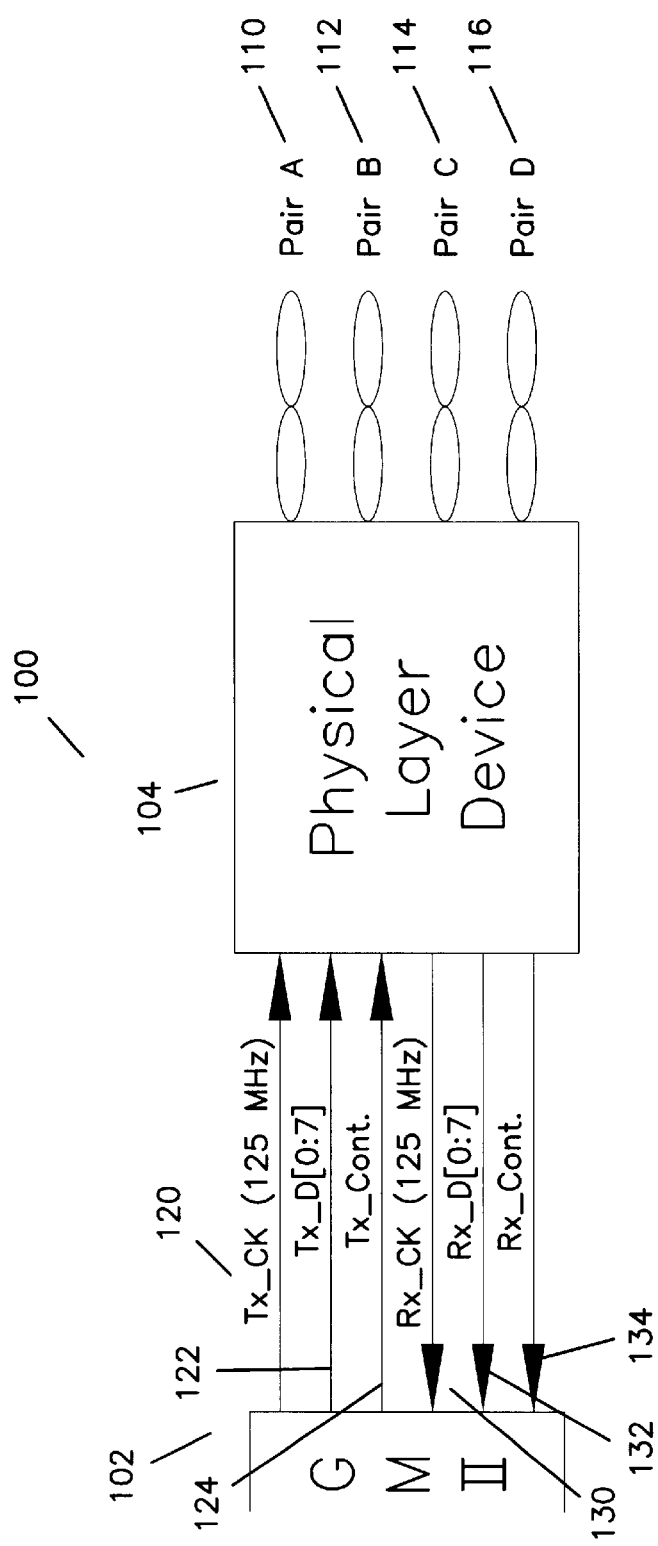
FIG. 1 illustrates the Gigabit Media Independent Interface (GMII) and the physical layer device.

FIG. 1 illustrates a block diagram of a gigabit system 100. In FIG. 1, a Gigabit Media Independent Interface (GMII) 102 provides signaling to a physical layer device 104. The invention achieves 1 Gbps Ethernet frame-format data transmission over 4-pairs 110–116 of Category 5 Unshielded Twisted-Pair (UTP-5) wiring in a reliable manner. The gigabit transmission rate is accomplished by embodying this invention in a Gigabit Ethernet physical layer device 104 for UTP-5 transmission and reception.

The Gigabit Ethernet Media Access Control (MAC) device (not shown) provides the physical layer device 104 with a 125 MHz clock 120 along with an 8-bit data word 122 and other control signals 124. This Interface is the Gigabit Media Independent Interface (GMII) 102.

The physical layer device 104 then transforms this data into voltage waveforms to be transmitted over 4-pairs 110–116 of UTP-5 wiring. Simultaneously, the physical layer device 104 receives voltage waveforms over the same 4-pairs 110–116 of UTP wiring and performs signal-processing operations on the received waveforms to recover a 125 Mhz clock 130, 8-bit data word 132 and control signals 134 which are they input to the Gigabit Media Independent Interface 102 and on to the Ethernet MAC device (not shown). Simultaneous transmission and reception on the same wiring is achieved by means of standard hybrid magnetics (similar to that used in telephone connections).

In order to encode the byte-wide data and control information onto the wire pairs, 5 distinct levels are used on each pair 110–116 of the UTP-5 wiring. In normal encoding, four of the levels represent two bits of data and the fifth level is an ESC symbol used to transmit control information. There are several aspects of control information that need to be transmitted to the other end so that the receiver can operate reliably:

Start of Packet (SOP) and End of Packet (EOP).

Idle/Data discrimination so that a receiver that misses detection of SOP or EOP does not stitch two data packets together.

Error indication in case an error has been detected in current data packet (by some other means). This is to inform the receiver at the other end of the error so that it can take appropriate steps for error handling.

Other information such as receiver status, scrambler state etc.

The five levels are represented by the integers −2, −1, 0, +1 and +2. The actual voltages that are applied to the wire-pairs 110–116 are derived from these levels after a random sign-inversion of the integers which removes any DC bias in the encoding, and multiplication of the resulting integer by a constant voltage, e.g., 250 mV.

In addition to mapping an 8-bit data word 122 over 4 wire-pairs 110–116 using 5-level encoding, each 8-bit word is protected with a parity bit such that:

the scheme still uses only 5-level encoding on each wire-pair, the ability to transmit control information is retained, the reliability of the data transmission is improved by 5.2 dB, the mapping and inverse mapping from data bits to 5-level symbols can be accomplished in an algorithmic fashion with a few simple gates.

In order to accomplish this, the 5-levels are first partitioned into two types as follows:

Type X contains two levels {−1, +1},

Type Y contains three levels {−2, 0, +2=ESC}.

Figure 2:
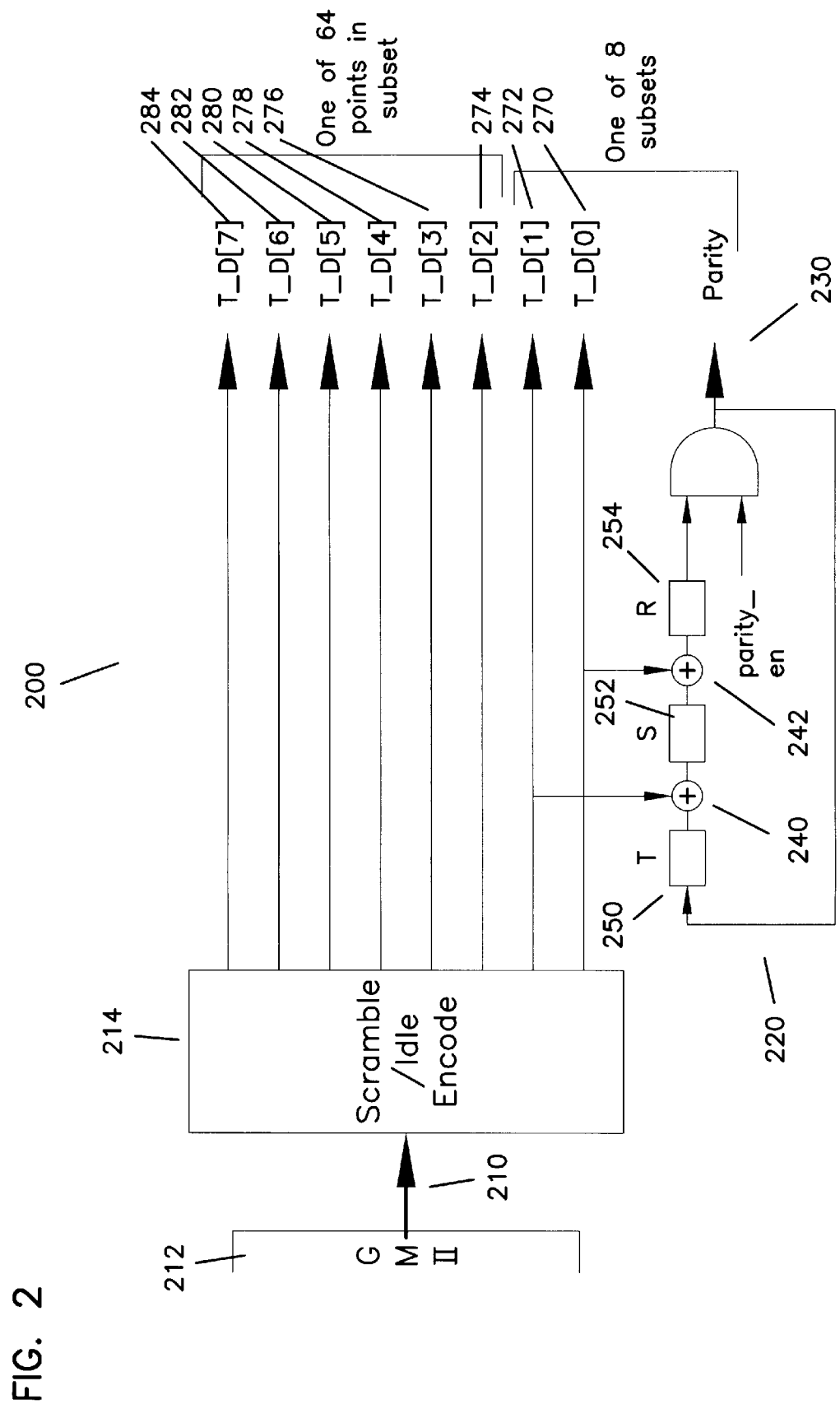
FIG. 2 illustrates a rate ⅔ convolutional encoder.

FIG. 2 illustrates an example of a rate ⅔ convolutional encoder 200 according to the present invention. The eight bit data word 210 from the Gigabit Media Independent Interface 212 is scrambled 214 and processed through, e.g., a rate ⅔ convolutional encoder 220, in order to generate the parity bit 230.

In FIG. 2, the parity bit 230 is generated with XOR gates 240, 242 and three registers, R 250, S 252, and T 254. An AND gate 256 is used to turn on or off, the generation of the parity bit 230. The parity enable signal 260, parity__en, is set by the link partner during initialization depending on whether or not it can take advantage of the parity encoding.

The least significant 2 bits 270, 272 of the scrambled data word, T__D[0:1] along with the Parity bit 230 is then used to select one of 8 subsets of 4-dimensional 5-level encoded points while the most significant 6 bits 274–84, T__D[2:7] are used to select one of 64 points within the chosen subset. The goal is to assign points to these subsets and perform the mapping in such a manner as to maximize the Euclidean (squared) distance between valid 5-level sequences that can occur at the transmitter.

The table 300 in FIG. 3 illustrates one example a subset assignment 302. In FIG. 3, eight subsets 304–318 are shown including the corresponding bit values of T__D[0:1] and parity 320. The eight subsets are then chosen as follows:

The 5-levels on each pair are partitioned into X and Y type levels.

A distinct 4-tuple XY pattern is assigned to each subset arbitrarily, with the provision that an X-type level is assigned to pair A. This is the X-primary code for the subset.

Next, each X is inverted to a Y and each Y to an X in the assignment chosen in the above step. This is the Y-primary code for the subset.

More specifically, for example, if XYXY 330 is the 4-tuple X-primary code 332 assigned to the subset D0 304, then YXYX 340 will be the 4-tuple Y-Primary code 342 assigned to subset D0 304. By this method, the squared distance between the 4-dimensional symbols assigned to any subset is greater than or equal to 4.

Figure 4:
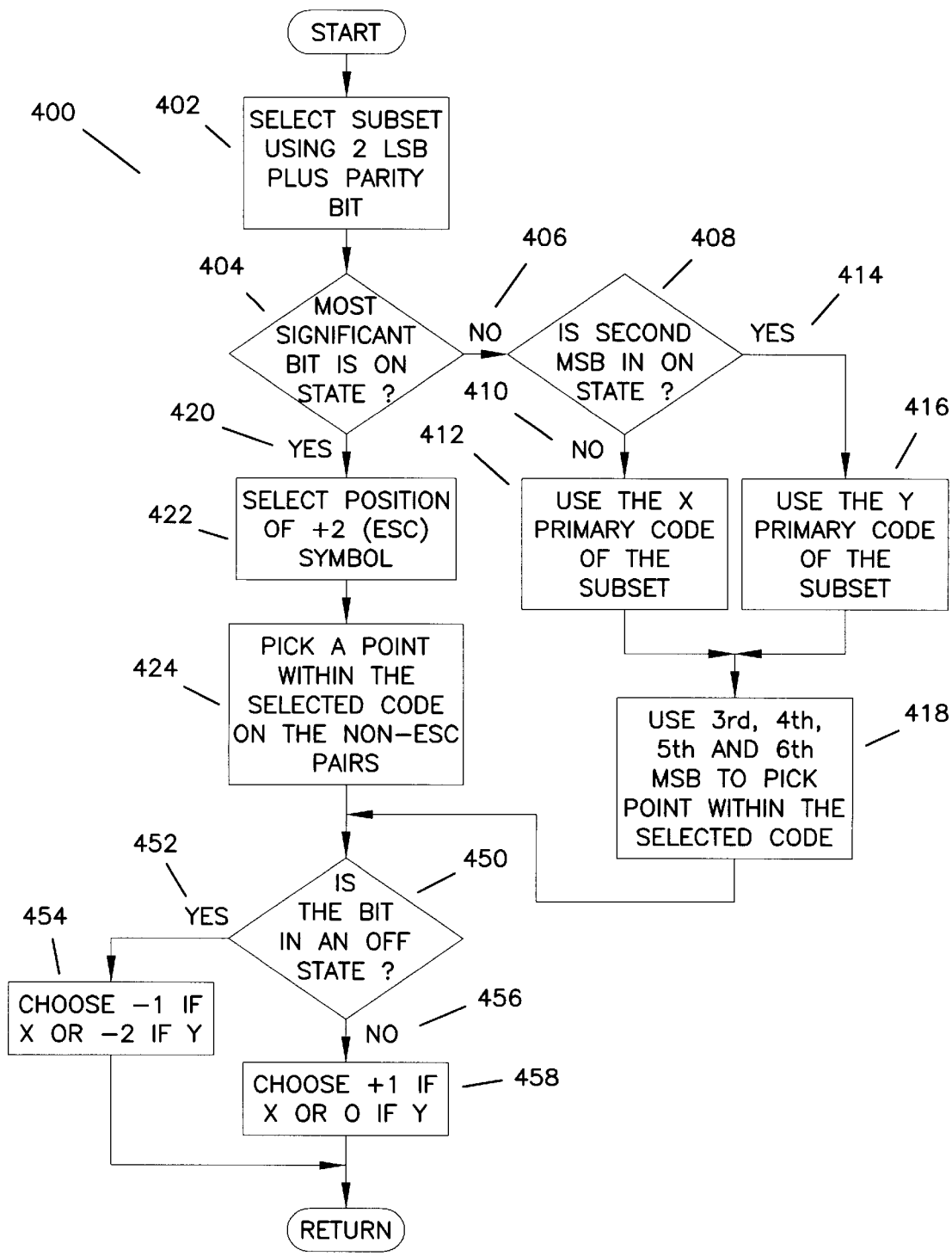
FIG. 4 illustrates a flow chart explaining the mapping of the randomized 8-bit data word to the 5-level symbols.

An algorithmic symbol mapping from the randomized 8-bit data word, T_D[0:7]+Parity to the 5-level symbols on the 4-wire pairs can be performed. FIG. 4 illustrates a flow chart 400 explaining the mapping of the randomized 8-bit data word to the 5-level symbols. First, the two least significant bits (LSB), T_D[0:1], and Parity are used to choose a subset, DI, 402 according to, for example, the table 300 of FIG. 3. Then, the most significant bits (MSB), T_D[2:7], are used to select a 4-dimensional point within the subset. The state of the most significant bit, T_D[7], is determined 404. If the most significant bit is in an off state 406, then the state of the second most significant bit, T_D[6], is determined 408. If the second most significant bit is in an off state 410, the X-primary code is used 412. If the second most significant bit is in an on state 414, the Y-primary code is used 416.

After determining the primary code to use, the third, fourth, fifth and sixth most significant bits are used to pick a point within the selected code. The state of the bit is determined 450. If the bit is in an off state 452, a −1 is chosen if an X type or a −2 is chosen if a Y type 454. If the bit is in an on state 456, a +1 is chosen if an X type or a 0 is chosen if a Y type 458.

If the state of the most significant bit was determined to be an on state 420, the position of the +2(ESC) symbol is selected using the second and third most significant bits, T_D[5:6]. Then a point is selected within the selected code on the non-ESC pairs 424 using the third, fourth, and fifth most significant bits, T_D[2:4]. The state of the bit is determined 450. If the bit is in an off state 452, a −1 is chosen if an X type or a −2 is chosen if a Y type 454. If the bit is in an on state 456, a +1 is chosen if an X type or a 0 is chosen if a Y type 458.

This algorithmic symbol assignment ensures that at most one ESC symbol is transmitted on the 4-pairs while encoding normal data. Therefore, control information can still be encoded using multiple ESC codes. For example, in order to transmit the Start of Packet or the End of Packet control code, +2 (ESC) symbols could be sent on all 4 pairs simultaneously. In order to transmit an error indication, +2 (ESC) symbols could be sent on 2 of the 4 pairs, while the other 2 pairs contain non-ESC symbols.

If the link partner sets the parity_en variable to ZERO during initialization, the above mapping ensures that only the points in even subsets, D0, D2, D4, and D6 are transmitted. Now, the even subsets have an even number of X symbols (also an even number of Y symbols) distributed across the 4 pairs. Therefore, the squared distance between valid points is 2, i.e., double that which is obtained without using this method. This results in a 3 dB improvement in the receiver performance due to the increased distance. However, this improvement is partly offset by a 0.8 dB increase in signal power needed for this method when compared to one that does not use an ESC symbol at all.

If the link partner sets the parity_en variable to ONE during initialization, the above mapping ensures that the squared distance between valid symbol sequences is 4, i.e., quadruple that which is obtained without using this method.

This results in a 6 dB improvement in receiver performance due to the increased distance. This improvement is partly offset by the 0.8 dB increase in signal power mentioned above and therefore the net gain obtained by this method is 5.2 dB.

This gain in receiver performance can be obtained by using a device such as a Viterbi decoder the expanded (trellis) graph of the convolutional encoding. For the convolutional encoder shown in FIG. 2, the expanded trellis depiction 500 is shown in FIG. 5.

Figure 5:
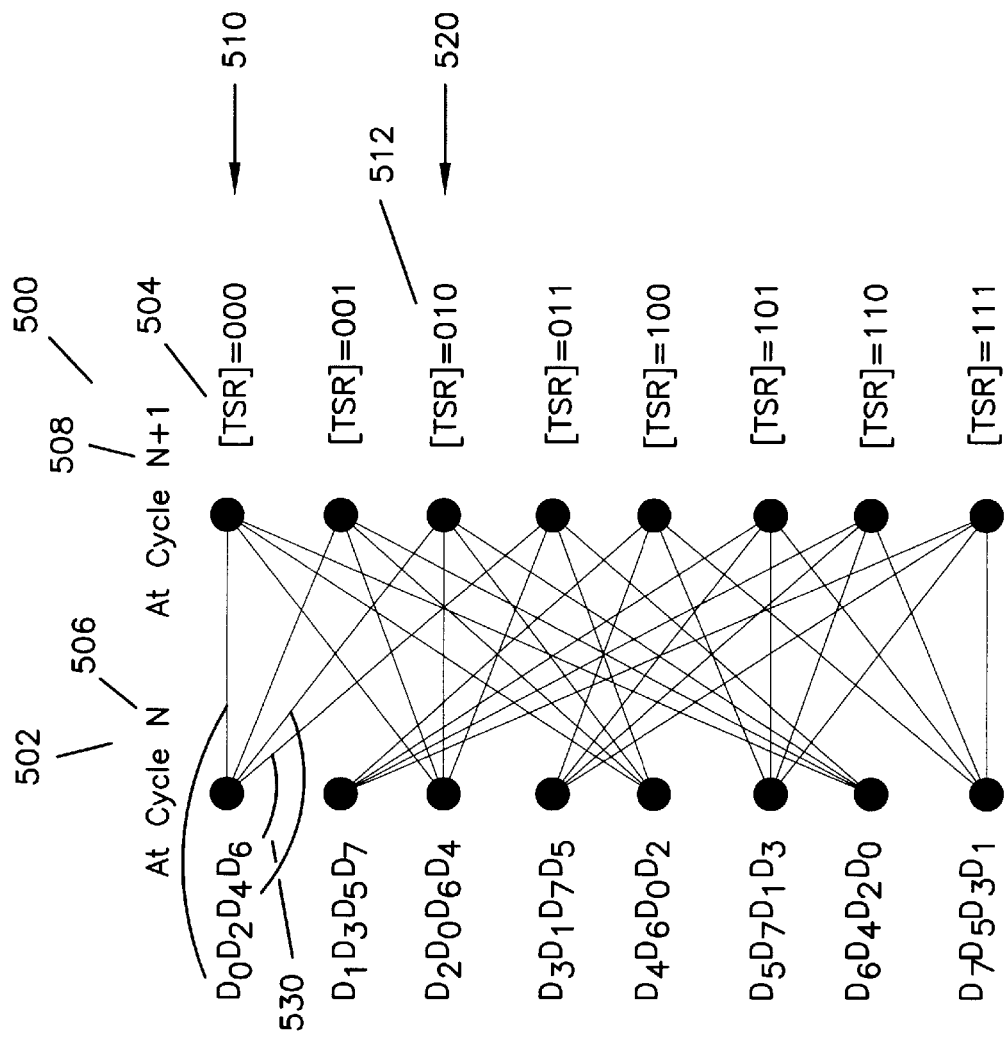
FIG. 5 illustrates an expanded trellis diagram for the convolutional encoder shown in FIG. 2.

In FIG. 5, each edge 502 corresponds to a transition of the contents of the registers 504, R, S and T from one clock period 506 to the next 508. For example, if R, S and T contain 0 values, i.e., [T S R]=000 510, and T_D[1]+1 and T_D[0]=0 for the current clock cycle, then at the next clock cycle, S will contain the value 1, while R and T will remain ZERO 512. In the trellis diagram, this is represented by the edge from state 0 510 to state 2 520, and it is labeled with the subset D4 530, since that is the subset that will be chosen by the above method.

Any valid data sequence coded by a transmitter corresponds to a path in the trellis diagram 500. The minimum squared distance between any two valid paths within the trellis is 4. Hence, we obtain the above-mentioned improvement in the receiver performance.

Figure 6:
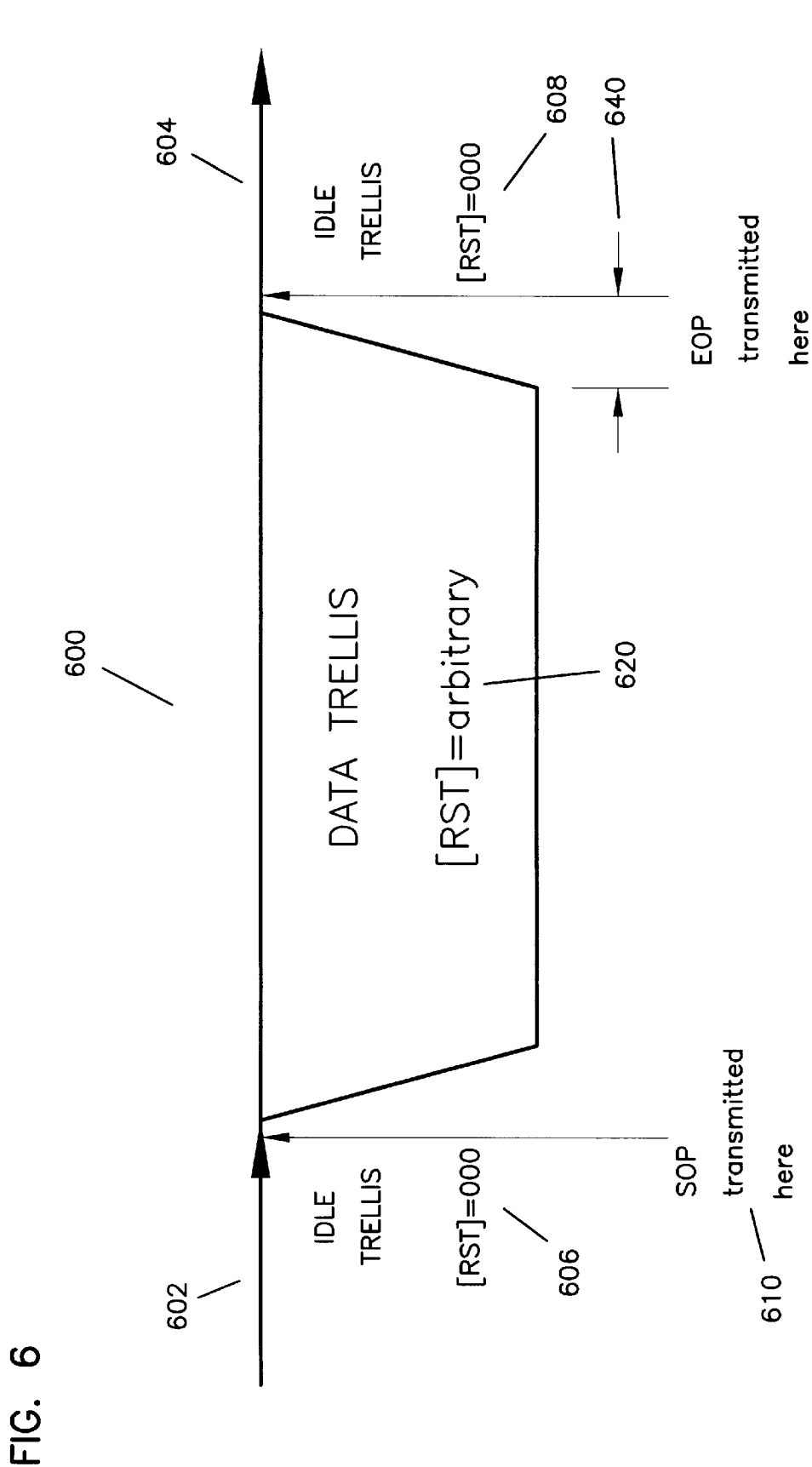
FIG. 6 illustrates the packetization of the trellis code in terms of the trellis diagram of FIG. 5.

FIG. 6 illustrates the packetization 600 of the trellis code in terms of the trellis diagram of FIG. 5. At initiation 602 and at the end of a packet 604, the registers of the convolution encoder have a value of 000 606, 608. Once data is ready, a Start of Packet is transmitted 610. During idle transmission, the states of the registers, R, S and T, in the convolutional encoder are set to 0 at every cycle. Therefore, only D0 symbols are transmitted during idle.

When the Ethernet MAC indicates that a data packet is to be transmitted, 4 ESC symbols are encoded on the wire-pairs to signify the Start of PACKET (SOP) 610 and to allow the R, S and T registers to take on any value as determined by the encoding. However, when the Ethernet MAC indicates an End of Packet (EOP), the registers, R, S and T, can be in any one of 8 states 620. If the EOP is simply encoded with 4 ESC symbols and reverted to idle, the reliability at the receiver would be lost for the few final symbols. This is because the receiver achieves its improved reliability of 5.2 dB by examining a number of consecutive symbols and making a decision on the value of a received symbol only after a few subsequent symbols have been received. This would be problematic.

In order to overcome this problem, the transmission of the EOP code is delayed by 2 symbols 640. In these intervening two cycles, the states of the registers, R, S and T in the convolutional encoder are restored to the value 000 by transmitting two appropriate symbols. Referring to FIG. 2, this can be achieved by using the second least significant bit 272, T_D[1], for the content of the register T 250, and the least significant bit 270, T_D[0], for the content of register S 252 for two cycles. Only after this is the EOP code transmitted. At the receiver, upon receipt of the EOP code, the decoding device can now make use of the fact that the final state of the trellis is the state 0, and read off the final symbols without incurring any penalty in the reliability of the decoding. The receiver must, however, discard the final two symbols.

In summary, a packetized trellis coder for providing error correction coding of IEEE 802.3 frame formatted Ethernet packets for transmission at one gigabit per second (Gbps) over twisted-pair wiring has been disclosed. The error correction code protects each byte of the ethernet frame with a parity bit constructed using a convolutional encoder such that a maximum likelihood sequence estimation at the receiver using a Viterbi decoder will result in a receiver performance gain on the order of 5.2 dB. At the end of the Ethernet packet, the trellis coder restores the states of the convolutional encoder to a known value (state 0) before beginning Idle transmission so that the Viterbi decoder at the receiver can read off the end-of-packet symbols without any performance penalty.

The present invention provides packetizing trellis codes such that the convolutional encoder is in a known state at the start and end of each data packet. The trellis coding is enabled and disabled on an individual basis such that the implementation of trellis decoding is optional for each receiver conforming to the same transmitter specifications. The mapping and the inverse mapping from raw data bits to symbols and vice-versa can be implemented with simple gates due to algorithmic symbol mapping of a 4-D trellis code via 1-D partitioning. The same redundancy that is needed for control code transmission in Ethernet frames is used to achieve trellis coding and to improve receiver performance.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of transmitting data from a transmitter to a receiver over a communication channel, comprising the steps of:

setting a convolutional encoder for generating a parity bit to a known state at the start and end of each data packet;

receiving an input data word of a data packet, the input word having a set of most significant bits and a set of least significant bits;

mapping the data word and the parity bit generated by the convolutional encoder over wire-pairs using a multi-level code;

using the parity bit and the set of least significant bits to select one of a plurality of subsets of encoded points; and using the set of most significant bits to select one of a plurality of points within the selected subset of encoded points.

2. The method of claim 1 wherein the method of mapping the data word further comprises the steps of:

partitioning the multi-level code on each wire pair into a first and second code type;

assigning a first distinct tuple pattern using the first and second code types to each of the plurality of subsets of encoded points, the first distinct tuple pattern forming a first primary code for a subset; and inverting each code type of the first distinct tuple pattern to form a second primary code for the subset.

3. The method of claim 2 wherein the step of using the most significant bit to select one of the plurality of points within the selected subset of encoded points, further comprises the steps of:

determining the state of the bits of the input word when the most significant bit of the set of most significant bits is in an on state, designating the first primary code if the second most significant bit in the set of most significant bits is in an off state and designating the second primary code if the second most significant bit in the set of most significant bits is in an off state, the remaining bits of the set of most significant bits being used to select a point within the designated primary or secondary code; and when the most significant bit of the set of most significant bits is in an off state, using the second and third most significant bits of the set of most significant bits to select the position of a first code level and using the three least significant bits of the set of most significant bits to select a point within the selected code on the other wire pairs.

4. The method of claim 3 wherein if the point within the designated primary or secondary code or if the point within the selected code on the other wire pairs is in an off state, a fourth level of the five level code is chosen if the point is a first code type and a fifth level of the five level code is chosen if the point is a second code type.

5. The method of claim 4 wherein the first code level represents an escape symbol.

6. The method of claim 5 wherein the position of an escape symbol selects either a first primary code or a second primary code within the subset.

7. The method of claim 1 wherein the input data word comprises an eight bit data word, the plurality of subsets of encode points comprising eight subsets and the plurality of points within the selected subset of encode points comprising sixty four points.

8. The method of claim 1 wherein the multi-level code comprises a four dimensional, five level code, the five level code further comprising a first, a second, a third, a fourth and a fifth code level.

9. The method of claim 8 wherein a first level code is transmitted on all four wire-pairs to transmit the start or end of packet control code.

10. The method of claim 8 wherein a first code level is transmitted on two pairs of the four wire-pairs and non-first code levels are transmitted on the other two pairs of the four wire-pairs to indicate an error indication.

11. The method of claim 1 wherein the convolutional encoder comprising a parity enable input, the parity enable input being set to an off state during initialization causes transmission of only points in even subsets, the even subsets having an even number of first type codes and second type codes distributed across the four pairs to double the squared distance between valid points.

12. The method of claim 1 wherein the convolutional encoder comprising a parity enable input, the parity enable input being set to an on state during initialization causing transmission of points in all subsets to quadruple the distance between valid points.

13. The method of claim 1 wherein an end of packet code is delayed by a predetermined number of cycles, the number of cycles being determined by the type of convolutional encoder being used to process the input data word to generate the parity bit.

14. The method of claim 13 wherein states in the convolutional encoder are set so that a zero value is obtain by the convolutional encoder after the predetermined number of cycles.

15. The method of claim 13 wherein the receiver discards the a final number of symbols equal to the predetermined number of cycles.

16. The method of claim 1 wherein the parity bit of the convolutional encoder is enabled and disabled on an individual basis by each receiver.

17. The method of claim 1 wherein the parity bit of the convolutional encoder is enabled and disabled on an individual basis by each receiver using the parity enable signal.

18. The method of claim 1 wherein the convolutional encoder is a rate ⅔ convolutional encoder.

19. The method of claim 18 wherein the rate ⅔ convolutional encoder comprises a first, a second and a third register, a first exclusive-or gate, a second exclusive-or gate, and an and gate, the first register storing the parity bit from the last cycle, the value of the first register and the seventh most significant bit being combined in a first exclusive or gate in a first delay cycle, the output of the first exclusive-or gate being combined with the least significant bit in a second delay cycle, and the output of the second exclusive-or gate being combined with the parity enable signal in the and gate to generate the parity bit.

20. A method of transmitting data from a transmitter to a receiver over a communication channel, comprising the steps of:

setting a convolutional encoder to a known state at the start and end of each data packet;

receiving an eight bit data word of a data packet;

mapping the data word and a parity bit generated by a convolutional encoder over four wire-pairs using a five-level code;

using the parity bit and the two least significant bits of the data word to select one of a eight subsets of encoded points; and using the six most significant bits to select one of sixty-four points within the selected subset of encoded points.

21. The method of claim 20 wherein the method of mapping the data further comprises the steps of:

partitioning the five level code on each wire pair into a first and a second code type;

assigning to each of the plurality of subsets of encoded points a first distinct four-tuple pattern using the first and second code types, the first distinct four-tuple pattern forming a first primary code for a subset; and inverting each code type of the first distinct four-tuple pattern to form a second primary code for the subset.

22. The method of claim 21 wherein the five level code further comprising a first, second, third, fourth and fifth level.

23. The method of claim 22 wherein the first level code is transmitted on all four wire-pairs to transmit a Start of Packet or End of Packet control code.

24. The method of claim 22 wherein a first level code is transmitted on two pairs of the four wire-pairs and non-first level codes are transmitted on the other two pairs of the four wire-pairs to indicate an error indication.

25. The method of claim 21 wherein the step of using the six most significant bits to select one of the sixty-four points within the selected subset of encoded points, further comprises the steps of:

determining the state of the bits of the eight bit data word;

when the most significant bit is in an on state, designating the first primary code for use if the second most significant bit is in an off state and designating the second primary code for use if the second most significant bit is in an off state, the third, fourth, fifth and sixth most significant bits being used to select a point within the designated primary or secondary code; and when the most significant bit is in an off state, using the second and third most significant bits to select a wire pair for a first code level and using the fourth, fifth and sixth most significant bits to select a point within the selected code on the other three wire pairs.

26. The method of claim 25 wherein if the point within the designated primary or secondary code or if the point within the selected code on the other three wire pairs is in an off state, a fourth level of the five level code is chosen if the point is a first code type and a fifth level of the five level code is chosen if the point is a second code type.

27. The method of claim 26 wherein the first code level represents an escape symbol.

28. The method of claim 26 wherein the position of the escape symbol selects either a first primary code or a second primary code within the subset.

29. The method of claim 20 wherein the convolutional encoder comprising a parity enable input, the parity enable input being set to an off state during initialization causes transmission of only points in even subsets, the even subsets having an even number of first type codes and second type codes distributed across the four pairs to double the squared distance between valid points.

30. The method of claim 20 wherein the convolutional encoder comprising a parity enable input, the parity enable input being set to an on state during initialization causing transmission of points in all subsets to quadruple the distance between valid points.

31. The method of claim 20 wherein an end of packet code is delayed by a predetermined number of cycles, the number of cycles being determined by the type of convolutional encoder being used to process the input data word for generating the parity bit.

32. The method of claim 31 wherein states in the convolutional encoder are set so that a zero value is obtain by the convolutional encoder after the predetermined number of cycles.

33. The method of claim 31 wherein the receiver discards the a final number of symbols equal to the predetermined number of cycles.

* * * * *

UNITED STATES PATENT AND TRADEMARK OFFICE
CERTIFICATE OF CORRECTION

PATENT NO. : 5,881,074

DATED : MARCH 9, 1999

INVENTOR(S) : RAO

It is certified that error appears in the above-identified patent and that said Letters Patent is hereby corrected as shown below:

On the title page: Item

, [60] Related U.S. Application Data: insert —Continuing data as claimed by applicant— — after the numeral "[60]"

Col. 1, line 2: "This application claims benefit of" should read —Continuing data as claimed by applicant— —

Col. 1, line 3: insert —No.— after the word "application"

Col. 8, line 7: insert —on— after the word "decoder"

Col. 10, line 27, claim 7: "encode" should read —encoded—

Col. 10, line 59, claim 14: "obtain" should read —obtained—

Col. 10, line 63, claim 15: delete "the" after the word "discards"

Col. 12, line 51, claim 33: delete "the" after the word "discards"

Signed and Sealed this

Ninth Day of January, 2001

*Attest:*

*Attesting Officer*

Q. TODD DICKINSON

*Commissioner of Patents and Trademarks*